United States Patent
Lindstedt et al.

(10) Patent No.: US 6,963,514 B2
(45) Date of Patent: Nov. 8, 2005

(54) METHOD FOR TESTING AN INTEGRATED SEMICONDUCTOR MEMORY, AND INTEGRATED SEMICONDUCTOR MEMORY

(75) Inventors: Reidar Lindstedt, München (DE); Dirk Fuhrmann, Essex Junction, VT (US)

(73) Assignee: Infineon Technologies AG, (DE)

( * ) Notice: Subject to any disclaimer, the term of this patent is extended or adjusted under 35 U.S.C. 154(b) by 0 days.

(21) Appl. No.: 11/017,857

(22) Filed: Dec. 22, 2004

(65) Prior Publication Data
US 2005/0162949 A1  Jul. 28, 2005

(30) Foreign Application Priority Data
Dec. 23, 2003 (DE) .............................. 103 61 024

(51) Int. Cl.⁷ .......................................... G11C 29/00
(52) U.S. Cl. .................. 365/201; 365/233; 365/185.25
(58) Field of Search ................ 365/201, 233, 365/185.25

(56) References Cited

U.S. PATENT DOCUMENTS 5,184,326 A * 2/1993 Hoffmann et al. .......... 365/201
5,689,465 A   11/1997 Sukegawa et al.
6,385,125 B1 * 5/2002 Ooishi et al. ............... 365/233

OTHER PUBLICATIONS

Infineon Technologies AG, 128-Mbit Synchronous DRAM, Sep. 2001, pp. 1-52.

* cited by examiner

Primary Examiner—Anh Phung
Assistant Examiner—N Nguyen
(74) Attorney, Agent, or Firm—Edell, Shapiro & Finnan, LLC

(57) ABSTRACT

An integrated semiconductor memory that can be tested includes a control circuit and a memory cell having a selection transistor. In a normal operating mode, the integrated semiconductor memory can be controlled by applying control signals and can be switched from a normal operating mode to a test operating mode by the applying a signal combination of the control signals. In the test operating mode, the control circuit interprets a first of the control signals as a signal for turning off the selection transistor and a second of the control signals or a signal combination of the control signals as a signal for switching the selection transistor into the on state. The method enables the testing of different times between reading a data set into the memory cell and turning off the selection transistor.

16 Claims, 4 Drawing Sheets

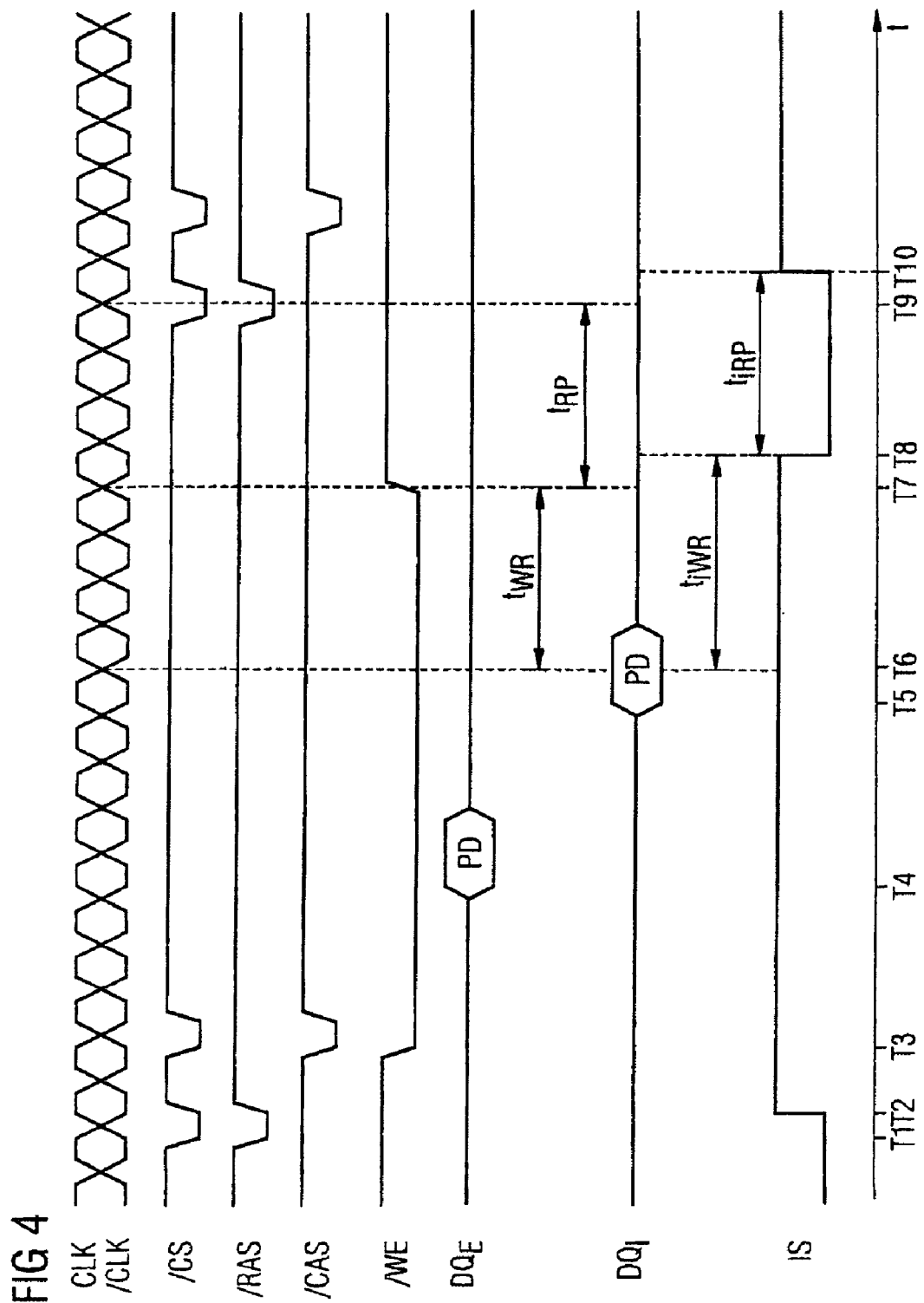

METHOD FOR TESTING AN INTEGRATED SEMICONDUCTOR MEMORY, AND INTEGRATED SEMICONDUCTOR MEMORY

CROSS REFERENCE TO RELATED APPLICATIONS

This application claims priority under 35 USC § 119 to German Application No. DE 10361024.3, filed on Dec. 23, 2003, and titled "Method for Testing an Integrated Semiconductor Memory, and Integrated Semiconductor Memory," the entire contents of which are hereby incorporated by reference.

FIELD OF THE INVENTION

The invention relates to a method for testing an integrated semiconductor memory and to an integrated semiconductor memory that can be tested.

BACKGROUND

The memory cell array of an integrated semiconductor memory, for example a DRAM (e.g., dynamic random access memory) semiconductor memory, contains storage capacitors connected to a bit line via a controllable path of a selection transistor. The selection transistor can be turned off or switched to the on state by applying a control signal to a control terminal. In order to write an information item to one of the memory cells of the memory cell array, the selection transistor of the respective memory cell is switched into the on state and the storage capacitor is charged to a predefined charge by the application of a write voltage to the bit line. The charge stored in the storage capacitor in this case corresponds to the information item to be stored. In this case, a high charge level corresponds to a logic state "1" (high state). A low charge level corresponds to a logic state "0" (low state). Once the information item has been stored in the memory cell, the selection transistor is turned off again. Afterward, the bit lines are precharged to a common potential during a precharge process.

Such a precharge process likewise takes place prior to read-out. In the precharge phase, the bit line and a reference bit line are precharged to a common equalization potential. The precharge can be carried out automatically as a so-called auto-precharge. After the end of the precharge phase, the selection transistor of the memory cell is switched into the on state once again, so that the charge stored on the storage capacitor alters the potential of the bit line. The potential on the bit line is subsequently compared with the potential on the reference bit line in a sense amplifier. Depending on the information item stored in the memory cell, the sense amplifier generates an output signal corresponding to the logic state "0" or to the logic state "1". Important parameters that characterize the write and read processes are the so-called write and precharge times. The write time is defined by the temporal interval between the instant at which the data are written to the memory cell array and the instant at which the selection transistor connected with the respective memory cell is turned off. The precharge time denotes the subsequent time interval between the instant at which the selection transistor is turned off and the instant at which the selection transistor is switched into the conductive state once again. The write and precharge times will be explained in greater detail with the aid of the signal state diagram illustrated in FIG. 1.

FIG. 1 illustrates a signal state diagram of an integrated DRAM semiconductor memory during a write process with subsequent auto-precharge. The first signal line illustrates the temporal profile of a clock signal CLK. In the normal operating state of the integrated semiconductor memory, the synchronous operating state, command signals CMD are each applied to the integrated semiconductor memory upon the rising and falling signal edges. In the command signal line, the illustration shows an activation signal ACT, a write signal W and a signal NOP, in the case of which no command is prescribed for the integrated semiconductor memory externally. An externally applied data set $DQ_E$ is illustrated in the third signal line. The fourth signal line illustrates the associated, for example time-delayed, internal data set $DQ_I$ that is read into one of the memory cells. The fifth signal line shows the profile of an internal control signal IS. The selection transistor is turned on upon a rising signal edge of the internal control signal and the selection transistor is turned off upon a falling signal edge of the internal control signal.

As can be gathered from the signal state diagram, the selection transistor of a selected memory cell is turned on after activation of the integrated semiconductor memory by the activation signal ACT by means of the state change of the internal control signal IS at the instant T1 from the low state to the high state. At the instant T2, the integrated semiconductor memory is driven by a write command W. At the instant T3, a data set D is applied to the data input of the integrated semiconductor memory. At the instant T4, said data set is read as internal data set into the selected memory cell. After the write time $t_{iWR}$ has elapsed, the selection transistor of the memory cell is turned off again at the instant T5 as a result of a signal state change of the internal control signal IS from the high state to the low state. In the case of an automatic precharge of the bit and reference bit lines, the precharge phase begins at the same instant. After the precharge time $t_{iRP}$ has elapsed, the selection transistor is switched into the on state again at the instant T6 in order, by way of example, to read out the information previously read into the memory cell.

The write and precharge times required for a successful write and read process are essentially determined by the design specifications and the technological processes. Precise knowledge of the write and precharge times therefore plays a significant part in the optimization of design and technological processes. Furthermore, the necessary write and precharge times, during the fabrication of the integrated semiconductor memory, give a first indication of whether memory cell elements are defective. If it is possible for the write and read times to be tested as early as at the wafer level, defective memory cells can still be replaced by redundant memory cell elements. Conventional wafer checking tests do not use a dedicated test mode for testing the write and precharge times of an integrated semiconductor memory. The two time parameters can be tested by the application of a write and read signal only to a limited extent. Joint testing of the two time parameters is not possible with present-day test systems. Furthermore, the access speed of semiconductor memories, which becomes faster and faster from generation to generation, presents the test systems with ever greater difficulties in accurate testing.

SUMMARY OF THE INVENTION

An aspect of the invention is to specify a method for testing the write and precharge times of an integrated semiconductor memory which can be used as early as during the fabrication of the integrated semiconductor memory in the course of wafer testing.

A further aspect of the invention is to specify an integrated semiconductor memory which enables write and precharge times to be tested in a simple manner during the fabrication of the integrated semiconductor memory.

The method according to the invention for testing an integrated semiconductor memory provides for an integrated semiconductor memory that can be controlled by the application of control signals. The integrated semiconductor memory has a terminal for reading data in and out and a memory cell array having memory cells that are arranged along word and bit lines and in each case comprise a selection transistor for selection of the respective memory cell. The integrated semiconductor memory can be operated in a normal operating state and a test operating state. The integrated semiconductor memory can be operated synchronously with respect to the profile of a clock signal in the normal operating state and synchronously and asynchronously with respect to the profile of the clock signal in the test operating state. One of the memory cells can be selected for a write and read access by the application of an address to the integrated semiconductor memory. The integrated semiconductor memory is switched from the normal operating state into the test operating state by the application of a signal combination formed from the control signals. During the operation of the integrated semiconductor memory in the test operating state, an activation signal and a write signal are subsequently applied to the integrated semiconductor memory synchronously with respect to the profile of the clock signal. On account of this, the memory cell associated with the applied address is selected for a write access by virtue of the selection transistor of the selected memory cell being turned on. During the operation of the integrated semiconductor memory, in the test operating state, a first test data set for reading into the selected memory cell is subsequently applied to the terminal for reading data in and out. Furthermore, in the test operating state, a first of the control signals is subsequently applied to the integrated semiconductor memory asynchronously with respect to the profile of the clock signal. Accordingly, the selection transistor of the selected memory cell is turned off. Likewise during the operation of the integrated semiconductor memory in the test operating state, the bit lines are subsequently precharged to a common equalization potential. During the operation of the integrated semiconductor memory, in the test operating state, a second of the control signals is subsequently applied to the integrated semiconductor memory asynchronously with respect to the profile of the clock signal, on account of which the selection transistor of the selected memory cell is turned on and the memory content of the selected memory cell is read out.

In one development of the method for testing the integrated semiconductor memory, during the operation of the integrated semiconductor memory in the normal operating state, the integrated semiconductor memory is configured for a write access and the selection transistor of the selected memory cell is turned on if the first of the control signals and a row select signal is applied to the integrated semiconductor memory synchronously with respect to the clock signal.

In one variant of the method for testing the integrated semiconductor memory, the integrated semiconductor memory is activated in the normal operating state if the second of the control signals is applied to the integrated semiconductor memory synchronously with respect to the clock signal.

During the operation of the integrated semiconductor memory in the normal operating state, the selection transistors of the memory cells of the memory cell array which are arranged along the word line associated with the applied address are turned on if the second of the control signals is applied to the integrated semiconductor memory synchronously with respect to the clock signal.

In accordance with one development of the method for testing the integrated semiconductor memory, a precharge time representing the time between an instant at which the selection transistor of the selected memory cell is turned off and an instant at which the selection transistor of the selected memory cell is switched into the on state can be set by virtue of the second of the control signals being shifted to the instant at which the selection transistor of the selected memory cell is turned off.

The at least required precharge time can be set by the application of the second of the control signals by virtue of the second of the control signals being temporally shifted with respect to the instant of the first of the control signals until the first test data set read into the selected memory cell can no longer be read out.

In another embodiment of the method for testing the integrated semiconductor memory, during the test operating state of the integrated semiconductor memory, the selection transistor of the selected memory cell is turned off after a predefined number of clock cycles of the clock signal have elapsed after the application of the first of the control signals, assuming that the second of the control signals is present at the integrated semiconductor memory.

According to the invention, a precharge time representing the time between an instant at which the selection transistor of the selected memory cell is turned off and an instant at which the selection transistor of the selected memory cell is switched into the on state can be set by virtue of the clock cycle of the clock signal being lengthened or shortened.

Accordingly, by means of the method, the at least required precharge time can be set by virtue of the clock cycle of the clock signal being shortened until the first test data set read into the selected memory cell can no longer be read out.

Furthermore, by means of the method according to the invention, a write time representing the time between an instant at which the first test data set is read into the selected memory cell and an instant at which the selection transistor of the selected memory cell is turned off can be set by virtue of the first of the control signals being shifted to the instant at which the first test data set is read in.

Accordingly, the at least required write time can be set by the application of the first of the control signals by virtue of the first of the control signals being temporally shifted with respect to the instant at which the first test data set is read in until the first test data set can no longer be stored in the selected memory cell.

In one development of the method according to the invention, it is provided that in the normal operating state of the integrated semiconductor memory, a second test data set is stored in the selected memory cell. The first test data set applied to the terminal for reading data in and out in the test operating state of the integrated semiconductor memory is applied in complemented fashion with respect to the second test data set stored in the normal operating state.

The method according to the invention can be used to test an integrated semiconductor memory, which can be operated in a normal operating state and in a test operating state. Additionally, the integrated semiconductor memory can be operated synchronously with respect to the profile of a clock signal in the normal operating state and asynchronously with respect to the profile of the clock signal in the test operating state. According to the invention, the integrated semiconductor memory has a terminal for reading data in and out, input terminals for applying control signals and a clock terminal for applying a clock signal. The integrated semiconductor memory furthermore has a control circuit for controlling the integrated semiconductor memory. The control circuit is connected to the input terminals and the clock terminal. The semiconductor memory furthermore comprises a memory cell array having memory cells having in each case a selection transistor for selection of the respective memory cell. According to the invention, the control circuit is designed in such a way that, in the normal operating state, it configures the integrated semiconductor memory for writing and turns on the selection transistor of the selected memory cell if the integrated semiconductor memory is driven with a first of the control signals and a row select signal synchronously with respect to the clock signal. Moreover, the control circuit is designed in such a way that it switches over the integrated semiconductor memory from the normal operating state into the test operating state upon application of a signal combination comprising the control signals. Furthermore, the control circuit is designed in such a way that, in the test operating state, it turns off the selection transistor of one of the memory cells selected by means of an address if the integrated semiconductor memory is driven with the first of the control signals asynchronously with respect to the clock signal. Moreover, the control circuit is designed in such a way that, in the test operating state, it turns on the selection transistor of one of the memory cells selected by means of an address if the integrated semiconductor memory is driven with the second of the control signals asynchronously with respect to the clock signal.

In one development of the integrated semiconductor memory, the control circuit is designed in such a way that, in the test operating state, it turns on the selection transistor of one of the memory cells selected by means of the address, after the application of the first of the control signals and after a predefined number of clock cycles of the clock signal have elapsed, assuming that the integrated semiconductor memory is driven with the second of the control signals.

According to another feature of the integrated semiconductor memory, the control circuit is designed in such a way that, in the normal operating state, it activates the integrated semiconductor memory if the second of the control signals is applied to the integrated semiconductor memory synchronously with respect to the clock signal.

In a further refinement of the integrated semiconductor memory, the memory cells are arranged along word lines and bit lines. The control circuit is preferably designed in such a way that, in the normal operating state, it turns on the selection transistors of the memory cells that are arranged along the word line to which the memory cell selected by means of the address is connected if the second of the control signals is applied to the integrated semiconductor memory synchronously with respect to the clock signal.

The above and still further aspects, features, and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The method for testing an integrated semiconductor memory will be explained in more detail below on the basis of the exemplary embodiments illustrated in the figures, in which:

FIG. 4 shows a signal state diagram in accordance with the method according to an aspect of the present invention for testing an integrated semiconductor memory.

DETAILED DESCRIPTION OF THE INVENTION

Figure 2:
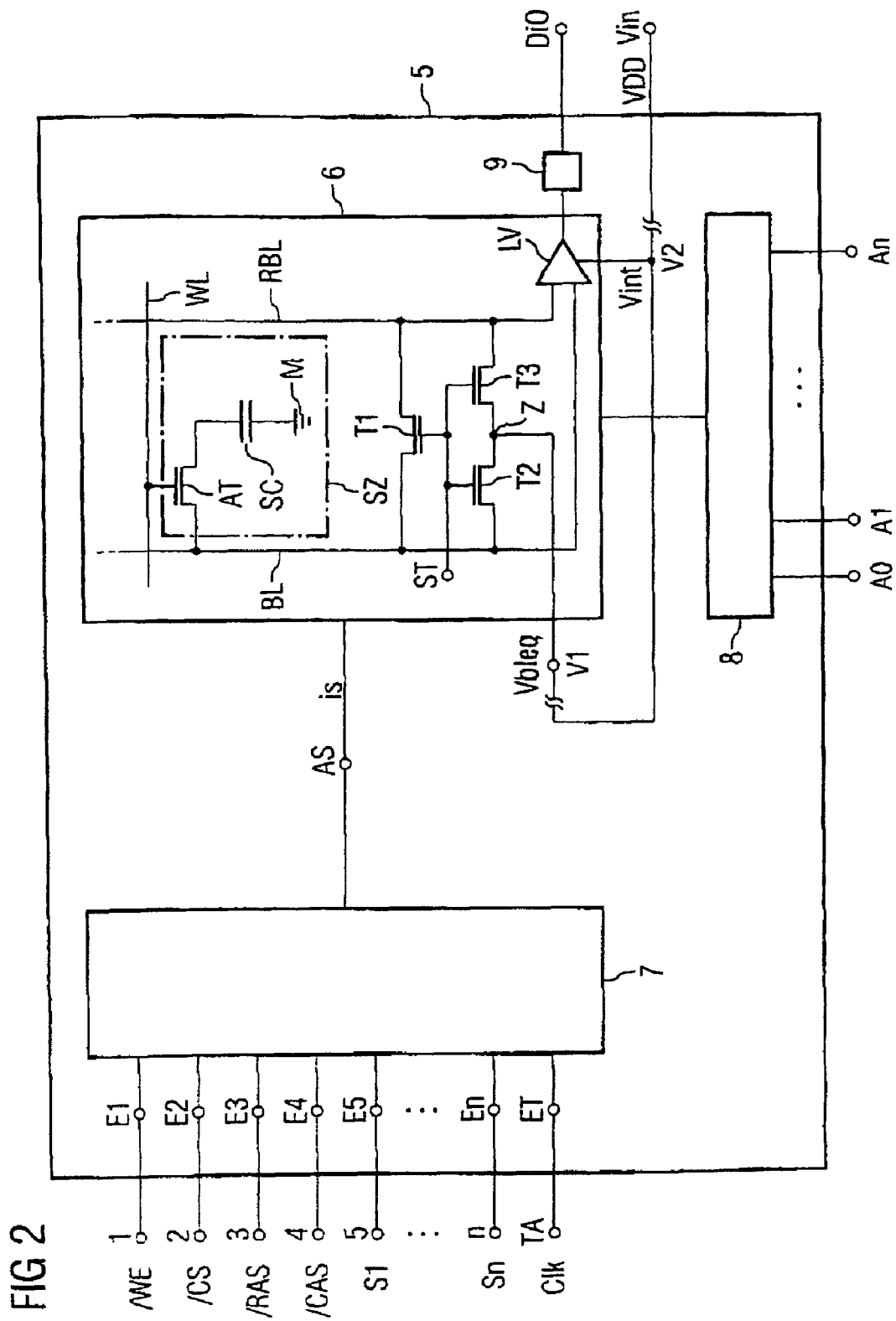
FIG. 2 shows an embodiment of an integrated semiconductor memory to be tested by the method according to an aspect of the present invention.

FIG. 2 shows an integrated semiconductor memory having a terminal Vin for applying a supply voltage VDD, and having a terminal DIO for reading data in and out, having address terminals A0, A1, . . . , An and also having a first input terminal 1, a second input terminal 2, a third input terminal 3, a fourth input terminal 4, further input terminals E5, . . . , En and a clock terminal TA. The first input terminal 1 is designed as a terminal for applying a first control signal /WE. The second input terminal 2 is designed as a terminal for applying a second control signal /CS. The third input terminal 3 is designed as a terminal for applying a third control signal /RAS. The fourth input terminal 4 is designed as a terminal for applying a fourth control signal /CAS. The further input terminals 5, . . . , n are designed as terminals for applying further control signals. The clock terminal TA is designed as a terminal for applying a clock signal CLK. The terminal DIO for reading data in and out is connected to a driver circuit 9. The address terminals A0, A1, . . . , An of the integrated semiconductor memory are connected to an address register 8. The address register 8 is connected via an address line AL to a memory cell array 6, in which a memory cell SZ is illustrated by way of example. The memory cell SZ of the memory cell array 6 can be uniquely identified by means of an address stored in the address register 8. The memory cell SZ is designed as a DRAM memory cell and comprises a storage capacitor SC, the first electrode of which is connected to a terminal M for applying a reference potential. The second electrode of the storage capacitor SC is connected to a bit line BL via a controllable path of a selection transistor AT. A control terminal of the selection transistor AT is connected to a word line WL. The memory cell array 6 furthermore comprises a reference bit line RBL. The bit line BL and the reference bit line RBL can be connected via the controllable paths of a plurality of switching transistors, for example of the switching transistors T1, T2 and T3 illustrated in FIG. 2. The controllable paths of the three switching transistors can be controlled by the application of the internal control signal IS to a control terminal ST. A common terminal Z of the controllable paths of the transistors T2 and T3 can be connected to a terminal V1 for applying a precharge potential Vbleq. The precharge potential Vbleq can be generated from the supply potential VDD applied to the terminal Vin for example with the aid of circuit components that are not illustrated in FIG. 2. Furthermore, the bit line BL and the reference bit line RBL are connected in each case to an input terminal of a sense amplifier LV. The output terminal of the sense amplifier LV is connected to the driver circuit 9. The sense amplifier has a terminal V2 for applying an internal voltage potential Vint, which is connected via further components (not currently illustrated) to the terminal Vin for applying the supply potential VDD. The integrated semiconductor memory furthermore comprises a control circuit 7 having a first input terminal E1, a second input terminal E2, a third input terminal E3, a fourth input terminal E4, further input terminals E5, ..., En, a clock signal terminal ET and an output terminal AS. The control circuit 7 is connected via its output terminal AS to the memory cell array 6 and feeds the internal control circuit AS to the memory cell array. The internal control signal IS can be used to control the writing of an information item to the memory cell, the read-out of an information item from the memory cell and also the precharging of the bit lines.

If an information item is intended to be written to the corresponding memory cell SZ, then the selection transistor AT of said memory cell can be switched into the on state by the internal control signal IS of the control circuit. In this case, the storage capacitor SC can be connected to the bit line BL via the controllable path of the selection transistor. When a data set present at the terminal DIO is read in, it is amplified in the driver circuit 9 and fed to the sense amplifier LV. Depending on the information item to be written in, the sense amplifier LV alters the potential of the bit line BL connected to the addressed memory cell. A charge corresponding to the information item is subsequently stored on the storage capacitor SC of the memory cell SZ.

In order to read out an information item stored in the memory cell SZ, the bit line BL and the reference bit line RBL are precharged to a bias voltage. For this purpose, the bit line BL and the reference bit line RBL are charged to the precharge potential Vbleq, which generally corresponds to half the maximum voltage of the bit line, via the switching transistors T1, T2 and T3. In order to read out a memory cell information item once again, the switching transistors T1, T2 and T3 are turned off again and the selection transistor AT of the memory cell SZ can be switched into the on state again by the internal control signal IS. An altered potential is established on the bit line BL depending on the charge state of the storage capacitor. If an information item corresponding to the logic state 1 is stored in the memory cell, then the potential on the bit line BL rises in relation to the potential on the reference bit line RBL. If an information item corresponding to the logic state 0 is stored in the memory cell, then the potential on the bit line BL assumes a lower value in relation to the potential of the reference bit line RBL. The sense amplifier LV amplifies the difference between the two potentials on the bit line and the reference bit line and generates at its output a logic signal that identifies the storage state of the memory cell SZ. This signal is amplified in the driver circuit 9 and fed to the output terminal DIO of the integrated semiconductor memory.

Figure 3:
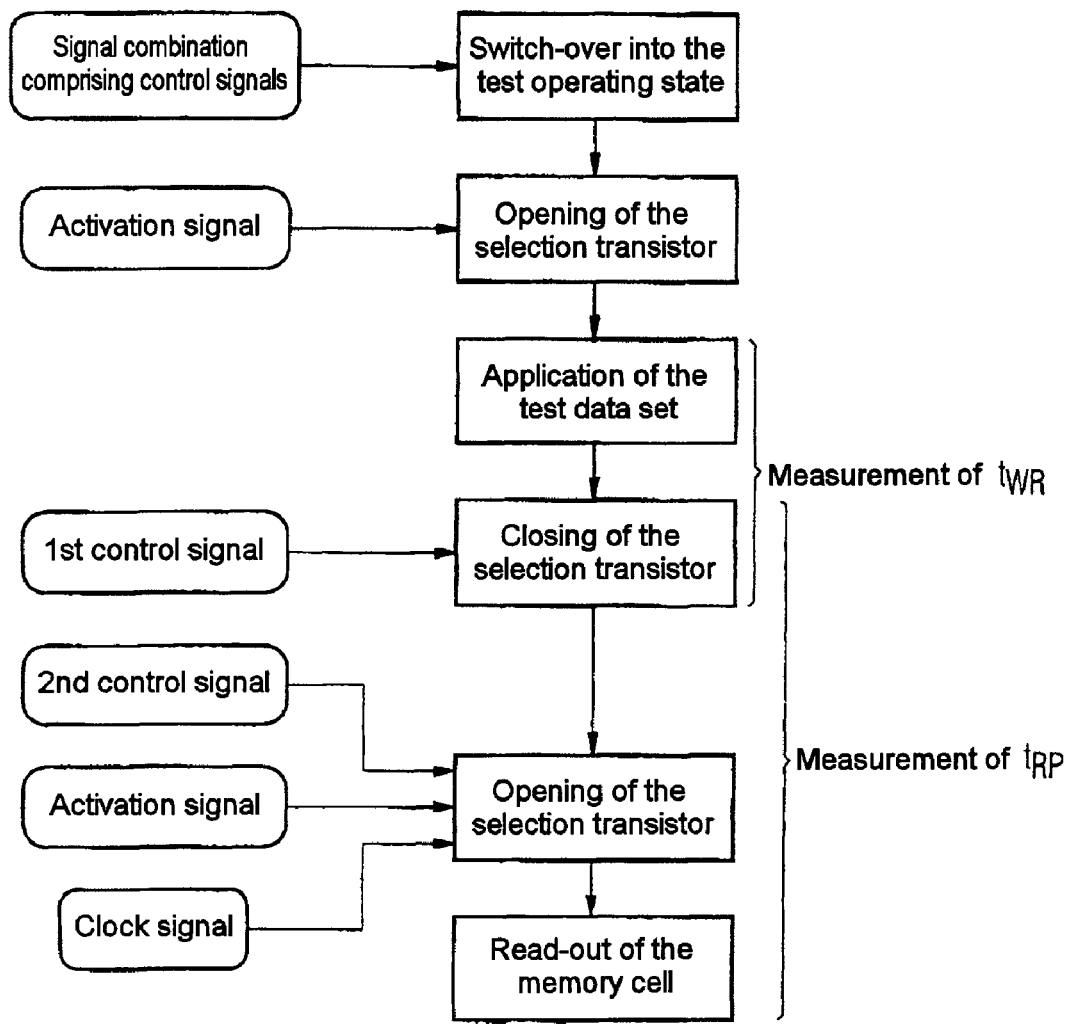
FIG. 3 shows a test sequence of the method according to an aspect of the present invention for testing an integrated semiconductor memory.

FIG. 3 shows the flow diagram of the method according to the invention for testing an integrated semiconductor memory. The method described below relates to the embodiment of the integrated semiconductor memory which is shown in FIG. 2. The reference symbols used below can be gathered from FIG. 2.

The test method enables the write and precharge times of the integrated semiconductor memory to be tested. In the normal operating state, the length of the write time and of the precharge time results according to an internally prescribed ratio formed from the temporal sequence of the external control signals. In order to be able to affect the switching of the selection transistor of a memory cell into the on or off state with the external control signals at times which are not coupled to the profile of the external clock signal, in the test operating mode of the integrated semiconductor memory, the control signals then have to be interpreted by the control circuit independently or asynchronously with respect to the profile of an external clock signal, in contrast to their interpretation in the normal operating state. For this purpose, at the beginning of the test method, the integrated semiconductor memory can be switched into a test operating state by a signal combination formed from the control signals. Any desired signal combination comprising the control signals described in FIG. 2 is involved in this case. In contrast to the normal operating state, in the test operating state the same control signals that are also used in the normal operating state are permissible even when they are applied to the integrated semiconductor memory independently or asynchronously with respect to the profile of the external clock signal. An activation signal for activating the semiconductor memory to be tested can be subsequently applied to the input terminals of the integrated semiconductor memory. The activation signal causes the selection transistor of a selected memory cell to be switched into the on state. A test data set can be subsequently applied to the data input DiO of the integrated semiconductor memory. After a write time to be tested, the first control signal can be applied to the first input terminal of the integrated semiconductor memory. In a first embodiment of the method for testing the integrated semiconductor memory, this signal can be interpreted by the control circuit in the test operating state as a signal for closing the selection transistor. After a precharge time to be tested, the second control signal can be applied to the second input terminal of the integrated semiconductor memory. This signal can be interpreted by the control circuit in the test operating state as a signal for switching the selection transistor into the on state. In a subsequent read-out process, a test can be effected to determine whether the data set has been read in correctly in the case of the write and precharge times set.

In a second embodiment of the method for testing the integrated semiconductor memory, the selection transistor is switched into the on state by a procedure in which, after the precharge time to be tested has elapsed, the activation signal that has already been used, after the switching of the integrated semiconductor memory into the test operating state, for switching the selection transistor into the on state is once again applied to the input terminals of the integrated semiconductor memory.

In a third embodiment of the method for testing the integrated semiconductor memory, the selection transistor is switched into the on state, in which the duration of the precharge time to be tested is set by means of the clock signal. The duration of the precharge time can be set by lengthening or shortening an individual clock cycle of the clock signal, assuming that the selection transistor is turned on again from the turned-off operating state by the control circuit after a specific number of clock signals.

Furthermore, it is possible, by way of example, to preallocate a data set to the memory cell in the normal operating state of the integrated semiconductor memory. The test data set read in during the test operating state represents a complementary data set with respect thereto. During the read-out of the memory cell, a test is effected to determine whether the memory cell has still stored the data set read in the normal operating state or the complementary test data set with respect thereto.

FIG. 4 shows a signal state diagram associated with the test method according to the invention. The control signals applied to the clock terminal TA and to the first, second, third and fourth input terminals of the integrated semiconductor memory of FIG. 2 are illustrated. The clock signal CLK of the first signal line corresponds to the clock signal of the integrated semiconductor memory. In the case of a synchronous operating mode of the integrated semiconductor memory, the control signals /RAS, /CAS, /WE and /CS are applied to the control terminals of the integrated semiconductor memory upon the edge of the clock signal CLK, for example the rising edge. In the case of an asynchronous operating mode, the control signals are generated at times that are not coupled to the clock signal. The second control signal /CS present at the second input terminal is illustrated in the second signal line of the signal state diagram. The third control signal /RAS present at the third input terminal is illustrated in the third signal line. The fourth control signal /CAS present at the fourth input terminal is illustrated in the fourth signal line. The first control signal /WE present at the first input terminal is illustrated in the fifth signal line. The test data set $DQ_E$ present externally at the terminal DiO for reading data in and out is illustrated in the sixth signal line. The associated internal data set $DQ_I$ is illustrated in the seventh signal line. The last signal line shows the profile of the internal control signal IS generated by the control circuit. The profile of the signals illustrated in the signal state diagram is plotted against a time axis t.

Figure 1:
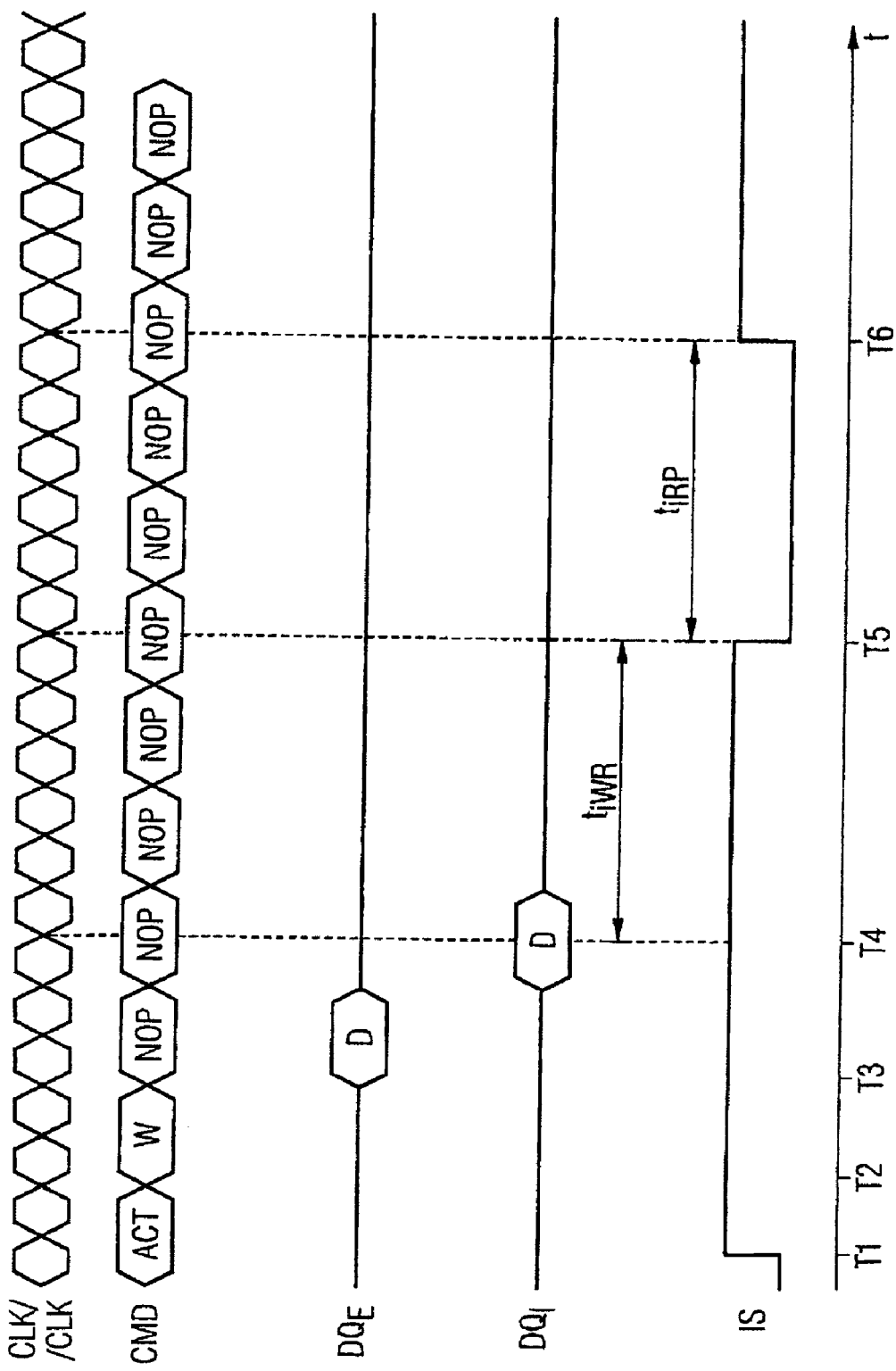
FIG. 1 shows a signal state diagram with a write time and a precharge time of an integrated semiconductor memory.

As was described in the case of the sequence control of the test method as illustrated in FIG. 2, the integrated semiconductor memory can be switched into a test operating state at the beginning of the test method. The switching into the test operating state is not illustrated in the signal state diagram of FIG. 4, but may be effected by means of any desired signal combination comprising the externally applied control signals. After the integrated semiconductor memory has been switched over into the test operating state, the control circuit can be driven by an activation signal ACT, which switches the selection transistors arranged along a word line (row line) into the on state. The activation signal ACT is applied to the control terminals at the instant T1 synchronously with the external clock signal CLK and is identified by the simultaneous transition of the second control signal /CS and of the third control signal /RAS from the high state to the low state. This change indicates that the address signals present at the address terminals A0, A1, . . . , An represent a valid row address. Afterward, the two control signals change to the high state again. At the instant T2, as a reaction to the externally applied activation signal, the control circuit generates a transition of the internal control signal IS from the low state to the high state. As a result, the selection transistors linked to the row address, that is to say all the selection transistors that are arranged along a word line, are switched into the on state. At the instant T3, the second control signal /CS again changes from the high state to the low state and at the same time the fourth control signal /CAS undergoes a transition from the high state to the low state. This state transition indicates that the address present at the address terminals represents a valid column address of the selected memory cell. Precisely one memory cell can now be addressed by means of the row and column addresses and the associated selection transistor can thus also be driven for the subsequent actions. Afterward, the two control signals /CS and /CAS change to the high state again. Likewise at the instant T3, the first control signal /WE changes from the high state to the low state. The signal combination comprising the control signals /CS, /CAS and /WE corresponds to the write signal W of FIG. 1. In contrast to the normal operating state of the integrated semiconductor memory, the first control signal /WE does not change back to the high state again, but rather remains in the low state. Such a profile of the control signal /WE is impermissible in the normal operating state.

As can further be gathered from the signal state diagram, at the instant T4, a test data set PD is applied to the external terminal DiO of the integrated semiconductor memory for reading data in and out. At the instant T5, said test data set is read into the addressed memory cell of the integrated semiconductor memory. The read-in of the test data set at the instant T6 identifies the beginning of the so-called external write time $t_{WR}$. The internal write time $t_{iWR}$ begins with a predefined delay. At the instant T7, as a result of the transition of the first control signal /WE from the low state to the high state, a command signal for turning off the selection transistor is applied to the first input terminal 1 of the integrated semiconductor memory. In this case, the first control signal /WE is applied to the first input terminal of the integrated semiconductor memory independently of the profile of the external clock signal CLK. Apart from the coupling of the control signals to the profile of the external clock signal CLK, the sole state change of the control signal /WE is impermissible in the normal operating mode. In the normal operating mode, the control signal /WE is always applied to the integrated semiconductor memory jointly with the control signal /CS and /CAS. The instant T7 identifies the end of the external write time $t_{WR}$. As a reaction to this command signal, the control circuit 7, at the instant T8, generates the internal control signal IS for closing the selection transistor. The internal control signal, which has been at the high state since the instant T2, changes to the low state for this purpose. The instant T8 identifies the end of the internal write time $t_{iWR}$.

In the test operating state, the write time can thus be tested by means of the first control signal /WE. A state change of said control signal from the low state to the high state is interpreted by the control circuit as a command signal for turning off the selection transistor. In contrast to the normal operating mode of the integrated semiconductor memory, the first control signal /WE is applied independently of the profile of the external clock signal CLK. In the normal operating mode, a state transition of the control signal /WE from the high state to the low state in the normal operating state can be used to configure the semiconductor memory for a write process. In the normal operating mode, the control signal /WE is valid when a state transition of the control signal /WE from the high state to the low state and back to the high state again is effected within a clock period of the external clock signal CLK. Thus, in contrast to what is shown in FIG. 4, the control signal is not held at a low level over a plurality of clock periods CLK.

After the driving of the integrated semiconductor memory as a result of the transition of the first control signal /WE from the low state to the high state or the turn-off of the selection transistor by the internal control signal IS, the precharge of the bit line and of the reference bit line begins. The beginning of the external precharge time $t_{RP}$ is identified by the transition of the first control signal /WE from the low state to the high state at the instant T7. The beginning of the internal precharge time $t_{iRP}$ is identified by the instant T8, at which the internal control signal IS changes from the high state to the low state. At the instant T9, the second control signal /CS exhibits a transition from the high state to the low state. At the same time the third control signal /RAS also changes from the high state to the low state. In a first embodiment of the method for testing the integrated semiconductor memory, the second control signal /CS serves as a command signal for once again switching the selection transistor into the on state. The instant T9 thus identifies the end of the external precharge time $t_{RP}$. In this case, in the test operating mode, the control signal /CS is applied to the integrated semiconductor memory independently of the profile of the external clock signal CLK. At the instant T10, the internal control circuit generates the internal control signal IS as a reaction to the application of the second control signal /CS. The selection transistor is turned on again with the transition of the internal control signal IS from the low state to the high state. The instant T10 identifies the end of the internal precharge time $t_{iRP}$. The test data set PD is then read out from the memory cell. The integrated semiconductor memory subsequently remains in the test operating state or is switched over into the normal operating state again by the control circuit.

In the test operating state, the precharge time can thus be tested by means of the second control signal /CS. A state change of this control signal from the high state to the low state is interpreted by the control circuit as a command signal for switching the selection transistor into the on state. In contrast thereto, a state change of the control signal /CS from the high state to the low state, in the normal operating state, is used for activating the integrated semiconductor memory, for example for a write or read access. Furthermore, in the normal operating mode, the control signal /CS is always applied to the second input terminal 2 of the integrated semiconductor memory synchronously with respect to the profile of the external clock signal CLK. By virtue of the coupling of the second control signal /CS to the profile of the external clock signal, in the normal operating mode, the selection transistor thus cannot be turned on at arbitrary times, as is the case in the invention's test operating mode of the integrated semiconductor memory.

If the write and precharge times set by the first and second control signals were sufficient, then the test data set read out corresponds to the test data set applied to the terminal DiO for reading data in and out at the instant T4.

As a result of the application of the first and second control signals /WE and /CS, it is possible to test write and precharge times of any desired length. The first and second control signals need not be synchronized with the rising and falling edges of the clock signal CLK for a test of the write and precharge times, but rather can be generated asynchronously at any desired instants of the clock signal CLK. As a result, the write and precharge times to be tested can be lengthened and shortened independently of the profile of the external clock signal CLK. In the normal operating mode, if the control signals /WE and /CS are coupled to the external clock signal CLK, there are always whole multiples of clock periods between turning on and turning off the selection transistors. The use of two independent control signals that can be shifted with respect to one another proves to be advantageous, particularly when testing the precharge time. This enables the testing of very short precharge times.

A critical write time can be determined by shortening the write time $t_{WR}$. For this purpose, the rising signal edge of the first control signal /WE is shifted near to the instant at which the test data set is read in until the set write time is too short to successfully store the test data set PD in the memory cell. A critical precharge time can be determined correspondingly. For this purpose, the falling signal edge of the second control signal /CS is shifted near to the rising edge of the first control signal /WE until the set precharge time is too short to successfully read out the stored data set. The method makes it possible to test the critical times of the write and precharge times individually but also jointly in a critical combination with respect to one another.

As has already been mentioned in the case of the description of the flow diagram of FIG. 3, two further embodiment variants of the method for testing the integrated semiconductor memory, which relate to setting the end of the precharge time, are also discernible on the basis of the signal state diagram of FIG. 4.

In a second embodiment of the method for testing the integrated semiconductor memory, the end of the precharge time can be set by application of the activation signal ACT formed from the combination of the first control signal /CS and the third control signal /RAS. The activation signal ACT is identified by the joint state change of the second control signal /CS and of the third control signal /RAS from the high state to the low state. As soon as the control circuit is driven with this state change of the two control signals /CS and /RAS in the test operating state of the integrated semiconductor memory, it generates the second state transition of the internal control signal IS from the low state to the high state at the instant T10, as a result of which the selection transistor AT is turned on. In the second embodiment, in the test operating state of the integrated semiconductor memory, the joint state transition of the first and second control signals /CS and /RAS from the high state to the low state is thus interpreted as a command signal for once again switching the selection transistor into the on state. The statements made above concerning the testing of the precharge time or the critical precharge time by means of temporally shifting the falling signal edge of the second control signal /CS to the instant of the rising edge of the first control signal /WE apply correspondingly to the falling signal edges of the activation signal used in the second embodiment.

In a third embodiment, the precharge time to be tested can be set by means of the clock signal, assuming that the second and third control signals /CS and /RAS have changed from the high state to the low state. If it is assumed that a defined number of clock cycles of the clock signal CLK lie between the instant T7 or T8 at which the selection transistor is turned off and the instant T9 or T10 at which the selection transistor is turned on again from the turned-off operating state by the control circuit, then the duration of the precharge time can be set by means of lengthening or shortening an individual clock cycle of the clock signal and thus by means of the frequency of the clock signal CLK. In order to determine the critical precharge time, the duration of an individual clock cycle is shortened until the set precharge time is too short to successfully read out the stored data set. A critical precharge time can thus be tested with the third embodiment, too.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1, . . . , n Input terminals of the integrated semiconductor memory
5 Integrated semiconductor memory
6 Memory cell array
7 Control circuit
8 Address register 9 Driver circuit
A Address terminal
ACT Activation signal
AL Address line
AS Output terminal of the control circuit
AT Selection transistor
BL Bit line
CMD Command signal
D Data set
DiO Data input and data output terminal
DQ Datastream
E Input terminal of the control circuit
ET Clock input terminal of the control circuit
IS Internal control signal
LV Sense amplifier
M Reference potential terminal
NOP No operation
PD Test data set
RBL Reference bit line
/CAS, S Control signals
SC Storage capacitor
ST Control terminal of the selection transistor
SZ Memory cell
T Switching transistor
TA Clock terminal of the integrated semiconductor memory
V terminal for applying an internal voltage potential
VDD external supply potential
Vbleq precharge potential
Vint internal supply potential
Vin terminal for external supply potential
W write signal
WL word line
Z common terminal of the controllable paths of the switching transistors T2 and T3
/WE first control signal
/CS second control signal
/RAS third control signal
/CLK clock signal

What is claimed is:

1. A method for testing an integrated semiconductor memory controllable by applying control signals, the integrated semiconductor memory comprising a terminal for reading data in and out, and a memory cell array including memory cells arranged along word and bit lines, each memory cell comprising a selection transistor operable to select the memory cell, the method comprising:
operating the integrated semiconductor memory in a normal operating state and in a test operating state, the integrated semiconductor memory operating synchronously with respect to a profile of a clock signal in the normal operating state, and operating synchronously and asynchronously with respect to the profile of the clock signal in the test operating state;
selecting at least one memory cell for at least one of a write and read access by applying an address to the integrated semiconductor memory;
switching the integrated semiconductor memory from the normal operating state to the test operating state by applying a signal combination formed from the control signals; and
during operation of the integrated semiconductor memory in the test operating state:
applying an activation signal and a write signal to the integrated semiconductor memory synchronously with respect to the profile of the clock signal to select the memory cell associated with the applied address for a write access by virtue of the selection transistor of the selected memory cell being turned on;
applying to the terminal a first test data set for reading into the selected memory cell;
applying a first of the control signals to the integrated semiconductor memory asynchronously with respect to the profile of the clock signal, thereby turning off the selection transistor of the selected memory cell;
precharging the bit lines to a common equalization potential; and
applying a second of the control signals to the integrated semiconductor memory asynchronously with respect to the profile of the clock signal, thereby turning on the selection transistor of the selected memory cell such that the memory content of the selected memory cell is read out.

2. The method for testing an integrated semiconductor memory as claimed in claim 1, wherein, during operation of the integrated semiconductor memory in the normal operating state, the integrated semiconductor memory is configured for a write access and the selection transistor of the selected memory cell is turned on in response to the first of the control signals and a row select signal being applied to the integrated semiconductor memory synchronously with respect to the clock signal.

3. The method for testing an integrated semiconductor memory as claimed claim 1, wherein, during operation of the integrated semiconductor memory the normal operating state, the integrated semiconductor memory is activated in response to the second of the control signals being applied to the integrated semiconductor memory synchronously with respect to the clock signal.

4. The method for testing an integrated semiconductor memory as claimed in claim 1, wherein during operation of the integrated semiconductor memory the normal operating state, the selection transistors of the memory cells of the memory cell array which are arranged along the word line associated with the applied address are turned on in response to the second of the control signals being applied to the integrated semiconductor memory synchronously with respect to the clock signal.

5. The method for testing an integrated semiconductor memory as claimed in claim 1, wherein a precharge time representing the time between an instant at which the selection transistor of the selected memory cell is turned off and an instant at which the selection transistor of the selected memory cell is switched into the on state is settable by shifting the second of the control signals to the instant at which the selection transistor of the selected memory cell is turned off.

6. The method for testing an integrated semiconductor memory as claimed in claim 1, wherein a minimum precharge time is set by temporarily shifting the second of the control signals with respect to the first of the control signals until the first test data set read into the selected memory cell can no longer be read out.

7. The method for testing an integrated semiconductor memory as claimed in claim 1, wherein during operation of the integrated semiconductor memory in the test operating state, the selection transistor of the selected memory cell is turned off after a predefined number of clock cycles of the clock signal have elapsed after applying the first of the control signals, provided the second of the control signals is present at the integrated semiconductor memory.

8. The method for testing an integrated semiconductor memory as claimed in claim 7, wherein a precharge time representing the time between the selection transistor of the selected memory cell being turned off and the selection transistor of the selected memory cell being switched into the on state is settable by lengthening or shortening the clock cycle of the clock signal.

9. The method for testing an integrated semiconductor memory as claimed in claim 7, wherein a minimum precharge time is set by shortening the clock cycle of the clock signal until the first test data set read into the selected memory cell can no longer be read out.

10. The method for testing an integrated semiconductor memory as claimed in claim 1, wherein a write time, representing the time between the first test data set being read into the selected memory cell and the selection transistor of the selected memory cell being turned off, is set by shifting the first of the control signals to a time at which the first test data set is read in.

11. The method for testing an integrated semiconductor memory as claimed in claim 1, wherein a minimum write time is set by temporarily shifting the first of the control signals with respect to a time at which the first test data set is read in until the first test data set can no longer be stored in the selected memory cell.

12. The method for testing an integrated semiconductor memory as claimed in claim 1, wherein:
    during the normal operating state of the integrated semiconductor memory, a second test data set is stored in the selected memory cell; and
    the first test data set applied to the terminal in the test operating state of the integrated semiconductor memory is applied in complemented fashion with respect to the second test data set stored in the normal operating state.

13. An integrated semiconductor memory device configured to be operable synchronously with respect to the profile of a clock signal in a normal operating state and synchronously and asynchronously with respect to the profile of the clock signal in a test operating state, the device comprising:
    a terminal for reading data in and out;
    a plurality of input terminals for applying control signals;
    a clock terminal for applying a clock signal;
    a control circuit operable to control the integrated semiconductor memory, wherein the control circuit is coupled to the input terminals and the clock terminal; and
    a memory cell array comprising memory cells, each memory cell including a selection transistor operable to select the memory cell;
    wherein:
    in the normal operating state, the control circuit is operable to configure the integrated semiconductor memory for writing and turns on the selection transistor of a selected memory cell in response to the integrated semiconductor memory being driven with a first of control signals and a row select signal synchronously with respect to the clock signal;
    the control circuit is operable to switch over the integrated semiconductor memory from the normal operating state to the test operating state upon application of a signal combination comprising at least one of the control signals;
    in the test operating state, the control circuit is operable to turn off the selection transistor of one of the memory cells selected by means of an address in response to the integrated semiconductor memory being driven with the first of the control signals asynchronously with respect to the clock signal; and
    in the test operating state, the control circuit is operable to turn on the selection transistor of one of the memory cells selected by an address in response to the integrated semiconductor memory being driven with the second of the control signals asynchronously with respect to the clock signal.

14. The integrated semiconductor memory as claimed in claim 13, wherein, in the test operating state, the control circuit is operable to turn on the selection transistor of one of the memory cells selected by the address after applying the first of the control signals after a predefined number of clock cycles of the clock signal have elapsed, provided the integrated semiconductor memory is driven with the second of the control signals.

15. The integrated semiconductor memory as claimed in claim 13, wherein, in the normal operating state, the control circuit is operable to activate the integrated semiconductor memory in response to the second of the control signals being applied to the integrated semiconductor memory synchronously with respect to the clock signal.

16. The integrated semiconductor memory as claimed in claim 13, wherein the memory cells are arranged along word lines and bit lines, and wherein, in the normal operating state, the control circuit is operable to turn on the selection transistors of the memory cells that are arranged along the word line to which the memory cell selected by the address is coupled in response to the second of the control signals being applied to the integrated semiconductor memory synchronously with respect to the clock signal.

* * * * *